(12) United States Patent
Park

(10) Patent No.: US 9,991,226 B2
(45) Date of Patent: Jun. 5, 2018

(54) SEMICONDUCTOR PACKAGES HAVING ASYMMETRIC CHIP STACK STRUCTURE

(71) Applicant: SK hynix Inc., Icheon-si, Gyeonggi-do (KR)

(72) Inventor: Jin Kyoung Park, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/491,099

(22) Filed: Apr. 19, 2017

(65) Prior Publication Data

US 2018/0122771 A1 May 3, 2018

(30) Foreign Application Priority Data

Oct. 28, 2016 (KR) .................. 10-2016-0142439

(51) Int. Cl.
| | |
|---|---|
| *H01L 23/48* | (2006.01) |
| *H01L 23/52* | (2006.01) |
| *H01L 29/40* | (2006.01) |
| *H01L 25/065* | (2006.01) |

(52) U.S. Cl.
CPC .............. *H01L 25/0652* (2013.01); *H01L 2225/06506* (2013.01); *H01L 2225/06562* (2013.01); *H01L 2225/06582* (2013.01)

(58) Field of Classification Search
CPC ....... H01L 25/0652; H01L 2225/06582; H01L 2225/06506; H01L 2225/06562
See application file for complete search history.

(56) References Cited

U.S. PATENT DOCUMENTS

| 8,947,931 B1* | 2/2015 | D'Abreu | H01L 27/11551 |
| | | | 365/185.05 |
| 2010/0007001 A1* | 1/2010 | Wang | H01L 23/481 |
| | | | 257/686 |
| 2011/0081750 A1* | 4/2011 | Machida | H01L 21/4842 |
| | | | 438/123 |
| 2012/0007227 A1* | 1/2012 | Cho | H01L 21/568 |
| | | | 257/686 |
| 2013/0093102 A1* | 4/2013 | Jung | H01L 25/50 |
| | | | 257/777 |
| 2015/0115438 A1* | 4/2015 | Lee | H01L 25/0652 |
| | | | 257/737 |
| 2015/0200187 A1* | 7/2015 | Park | H01L 24/32 |
| | | | 257/777 |

FOREIGN PATENT DOCUMENTS

KR      1020150058469 A      5/2015

\* cited by examiner

*Primary Examiner* — Victor A Mandala
(74) *Attorney, Agent, or Firm* — William Park & Associates Ltd.

(57) ABSTRACT

A semiconductor package may include first chip stack including first chips which are stacked on a package substrate and offset to form a first reverse stepwise sidewall. The semiconductor package may include a second chip stack including second chips which are stacked on the package substrate and offset to form a second reverse stepwise sidewall. The first protrusion corner of the first chip stack may protrude toward the second chip stack.

18 Claims, 4 Drawing Sheets

SEMICONDUCTOR PACKAGES HAVING ASYMMETRIC CHIP STACK STRUCTURE

CROSS-REFERENCE TO RELATED APPLICATIONS

The present application claims priority under 35 U.S.C 119(a) to Korean Application No. 10-2016-0142439, filed on Oct. 28, 2016, which is incorporated herein by reference in its entirety.

BACKGROUND

1. Technical Field

Embodiments of the present disclosure may generally relate to semiconductor packages and, more particularly, to semiconductor packages having an asymmetric chip stack structure.

2. Related Art

In the electronics industry, various techniques for stacking a plurality of semiconductor chips have been developed to increase the number of semiconductor chips embedded in a single semiconductor package. That is, various packaging techniques have been proposed to increase a memory capacity of the semiconductor package. For example, a plurality of NAND-type semiconductor memory chips may be stacked to be laterally offset to realize larger capacities for NAND-type semiconductor memory packages. In such a case, the stacked NAND-type semiconductor memory chips may provide a step structure. The large capacity of semiconductor memory packages may be employed in electronic systems necessitating a large memory capacity. In the event that a plurality of semiconductor chips are stacked in a semiconductor package, a thickness of the semiconductor package may increase. Thus, a lot of effort has been focused on developing larger capacities for the semiconductor memory packages without increasing a thickness of the larger capacity semiconductor memory packages.

SUMMARY

According to an embodiment, a semiconductor package may be provided. The semiconductor package may include first chip stack including first chips which are stacked on a package substrate and offset to form a first reverse stepwise sidewall. The semiconductor package may include a second chip stack including second chips which are stacked on the package substrate and offset to form a second reverse stepwise sidewall. The first protrusion corner of the first chip stack may protrude toward the second chip stack.

According to an embodiment, a semiconductor package may be provided. The semiconductor package may include first chips which are stacked on a package substrate and offset in a first offset direction. The semiconductor package may include a second chip stack including second chips which are stacked on the package substrate and offset in a second offset direction. The semiconductor package may include a first spacer disposed between two adjacent chips of the first chips. The semiconductor package may include a second spacer disposed between two adjacent chips of the second chips. A first protrusion corner of the first chip stack may protrude toward the second chip stack with a second protrusion corner of the second chip stack protruding towards the first chip stack, and a thickness of the second spacer may be different from a thickness of the first spacer.

According to an embodiment, a semiconductor package may be provided. The semiconductor package may include a first chip stack and a second chip stack. The first chip stack may include first chips which are stacked on a package substrate and offset in a first offset direction. The second chip stack may include second chips which are stacked on the package substrate and offset in a second offset direction corresponding to an opposite direction to the first offset direction. A first protrusion corner of the first chip stack may protrude toward the second chip stack vertically overlapping with a second protrusion corner of the second chip stack which may be protruding toward the first chip stack.

According to an embodiment, a semiconductor package may include a first chip stack including first chips which are stacked on a package substrate and offset in a first offset direction. The semiconductor package may include a second chip stack including second chips which are stacked on the package substrate and offset in a second offset direction corresponding to an opposite direction to the first offset direction. A first spacer may be disposed between two adjacent chips of the first chips, and a second spacer may be disposed between two adjacent chips of the second chips. A first protrusion corner of the first chip stack protruding toward the second chip stack may vertically overlap with a second protrusion corner of the second chip stack protruding toward the first chip stack. A thickness of the second spacer may be different than a thickness of the first spacer.

According to an embodiment, a semiconductor package may include a first sub-chip stack and a second sub-chip stack. The first sub-chip stack may include first sub-chips which are stacked on a package substrate and offset in a first offset direction. The second sub-chip stack may include second sub-chips which are stacked on the first sub-chip stack. Each of the second sub-chips may have a thickness which is different than a thickness of each of the first sub-chips. A first spacer may be disposed between the first and second sub-chip stacks. The first sub-chip stack, the second sub-chip stack and the first spacer may constitute a first chip stack. A second chip stack may be disposed on the package substrate. A first protrusion corner of the first chip stack protruding toward the second chip stack may vertically overlap with a second protrusion corner of the second chip stack protruding toward the first chip stack.

According to an embodiment, there may be provided a memory card including a semiconductor package. The semiconductor package may include a first chip stack and a second chip stack. The first chip stack may include first chips which are stacked on a package substrate and offset in a first offset direction. The second chip stack may include second chips which are stacked on the package substrate and offset in a second offset direction corresponding to an opposite direction to the first offset direction. A first protrusion corner of the first chip stack protruding toward the second chip stack may vertically overlap with a second protrusion corner of the second chip stack protruding toward the first chip stack.

According to an embodiment, there may be provided a memory card including a semiconductor package. The semiconductor package may include a first chip stack including first chips which are stacked on a package substrate and offset in a first offset direction, a second chip stack including second chips which may be stacked on the package substrate and offset in a second offset direction corresponding to an opposite direction to the first offset direction, a first spacer may be disposed between two adjacent chips of the first chips, and a second spacer may be disposed between two adjacent chips of the second chips. A first protrusion corner of the first chip stack protruding toward the second chip stack may vertically overlap with a second protrusion corner of the second chip stack protruding toward the first chip stack. A thickness of the second spacer may be different than a thickness of the first spacer.

According to an embodiment, there may be provided a memory card including a semiconductor package. The semiconductor package may include a first sub-chip stack and a second sub-chip stack. The first sub-chip stack may include first sub-chips which are stacked on a package substrate and offset in a first offset direction, and the second sub-chip stack may include second sub-chips which may be stacked on the first sub-chip stack. Each of the second sub-chips may have a thickness which is different than a thickness of each of the first sub-chips. A first spacer may be disposed between the first and second sub-chip stacks. The first sub-chip stack, the second sub-chip stack and the first spacer may constitute a first chip stack. A second chip stack may be disposed on the package substrate. A first protrusion corner of the first chip stack protruding toward the second chip stack may vertically overlap with a second protrusion corner of the second chip stack protruding toward the first chip stack.

According to an embodiment, there may be provided an electronic system including a semiconductor package. The semiconductor package may include a first chip stack and a second chip stack. The first chip stack may include first chips which are stacked on a package substrate and offset in a first offset direction. The second chip stack may include second chips which may be stacked on the package substrate and offset in a second offset direction corresponding to an opposite direction to the first offset direction. A first protrusion corner of the first chip stack protruding toward the second chip stack may vertically overlap with a second protrusion corner of the second chip stack protruding toward the first chip stack.

According to an embodiment, there may be provided an electronic system including a semiconductor package. The semiconductor package may include a first chip stack including first chips which are stacked on a package substrate and offset in a first offset direction, a second chip stack including second chips which may be stacked on the package substrate and offset in a second offset direction corresponding to an opposite direction to the first offset direction, a first spacer may be disposed between two adjacent chips of the first chips, and a second spacer may be disposed between two adjacent chips of the second chips. A first protrusion corner of the first chip stack protruding toward the second chip stack may vertically overlap with a second protrusion corner of the second chip stack protruding toward the first chip stack, and a thickness of the second spacer may be different than a thickness of the first spacer.

According to an embodiment, there may be provided an electronic system including a semiconductor package. The semiconductor package may include a first sub-chip stack and a second sub-chip stack. The first sub-chip stack may include first sub-chips which may be stacked on a package substrate and offset in a first offset direction, and the second sub-chip stack may include second sub-chips which may be stacked on the first sub-chip stack. Each of the second sub-chips may have a thickness which is different than a thickness of each of the first sub-chips. A first spacer may be disposed between the first and second sub-chip stacks. The first sub-chip stack, the second sub-chip stack and the first spacer may constitute a first chip stack. A second chip stack may be disposed on the package substrate. A first protrusion corner of the first chip stack protruding toward the second chip stack may vertically overlap with a second protrusion corner of the second chip stack protruding toward the first chip stack.

DETAILED DESCRIPTION

Figure 1:
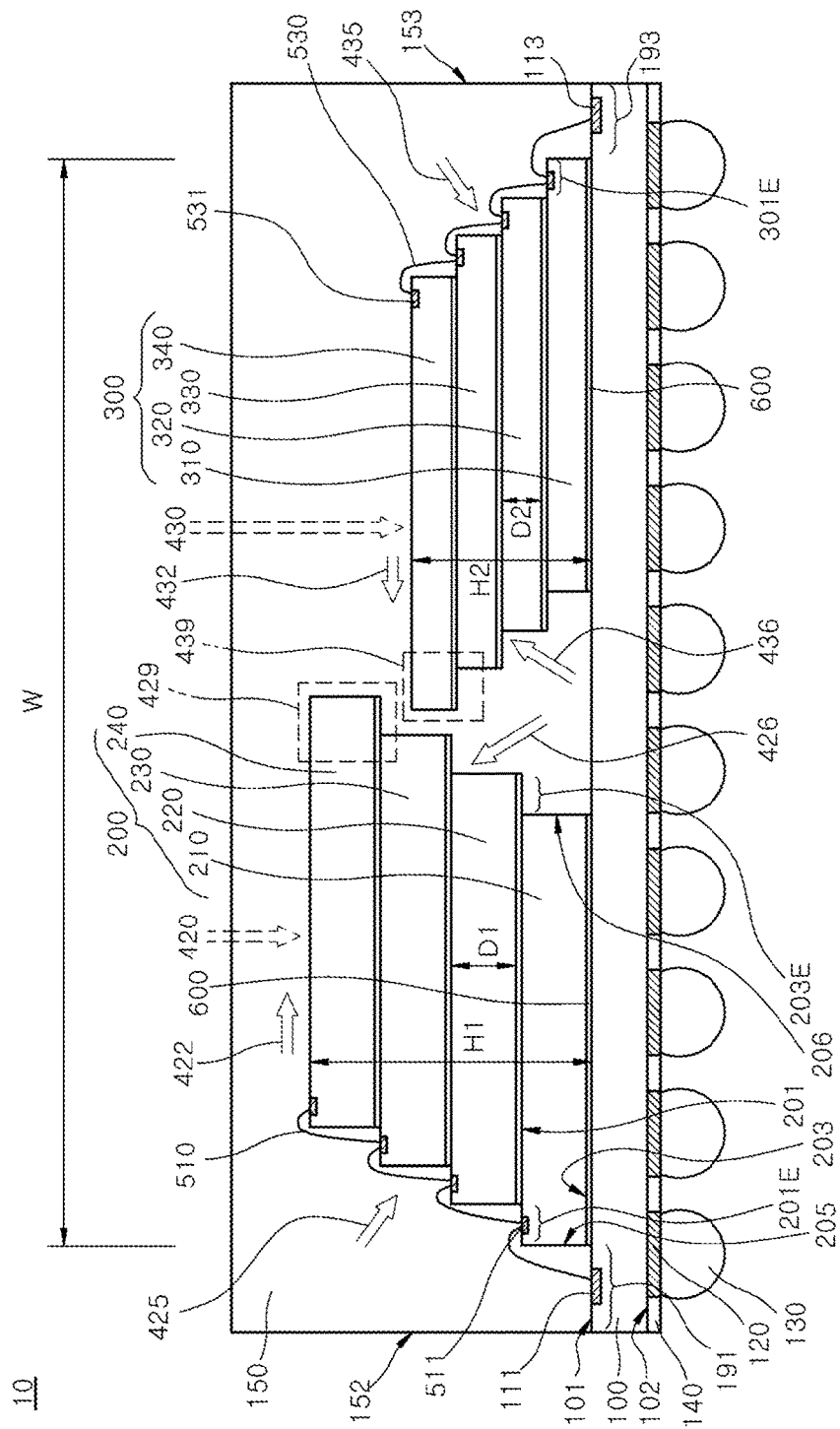
FIG. 1 is a cross-sectional view illustrating a representation of an example of a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

FIG. 1 is a cross-sectional view illustrating a representation of an example of a semiconductor package 10 according to an embodiment.

Referring to FIG. 1, the semiconductor package 10 may include a first chip stack 420 and a second chip stack 430 which are stacked side by side on a package substrate 100. The first chip stack 420 and the second chip stack 430 may be stacked on the package substrate 100 to be adjacent to each other in a lateral direction which is parallel to a surface of the package substrate 100. The first chip stack 420 may include a plurality of first semiconductor chips 200 which are vertically stacked on the package substrate 100, and the second chip stack 430 may include a plurality of second semiconductor chips 300 which are vertically stacked on the package substrate 100. The first chip stack 420 and the second chip stack 430 may be asymmetric with respect to a vertical straight line between the first chip stack 420 and the second chip stack 430. The first chip stack 420 and the second chip stack 430 may be disposed on the package substrate 100 to have different shapes. Since the first chip stack 420 and the second chip stack 430 are stacked side by side on the package substrate 100, the number of semiconductor chips mounted on the package substrate 100 may increase whereas an entire thickness of the package substrate 100 is reduced.

The package substrate 100 may function as an interconnect structure for electrically connecting the semiconductor chips 200 and 300 embedded in the semiconductor package 10 to an external device or an external system. A configuration and a shape of the package substrate 100 may be designed to be different according to the embodiments. For example, the package substrate 100 may be a printed circuit board (PCB), an interposer or a flexible printed circuit board (FPCB).

The package substrate 100 may have a first substrate surface 101 on which the first and second chip stacks 420 and 430 are stacked and a second substrate surface 102 which is opposite to the first and second chip stacks 420 and 430. The package substrate 100 may include a substrate body comprised of an insulation material or a dielectric material and conductive trace patterns disposed on the first and second substrate surfaces 101 and 102. The conductive trace patterns may include chip connection patterns 111 and 113 disposed on the first substrate surface 101 of the package substrate 100. The conductive trace patterns may further include ball connection patterns 120 disposed on the second substrate surface 102 of the package substrate 100. The conductive trace patterns may still further include inner conductive trace patterns (not illustrated) that are disposed in the substrate body to electrically connect the chip connection patterns 111 and 113 to the ball connection patterns 120.

The first and second semiconductor chips 200 and 300 constituting the first and second chip stacks 420 and 430 may be electrically connected to the chip connection patterns 111 and 113. Outer connectors 130 such as solder balls or bumps may be attached to the ball connection patterns 120 to electrically connect the ball connection patterns 120 to an external device or an external system. In some embodiments, the outer connectors 130 may be comprised of a solder paste material to electrically connect the ball connection patterns 120 to an external device or an external system. The semiconductor package 10 may further include a dielectric layer 140 disposed on the second substrate surface 102 of the package substrate 100. The dielectric layer 140 may be disposed to expose the ball connection patterns 120. The dielectric layer 140 may include a solder resist material.

First chip connection patterns 111 of the chip connection patterns 111 and 113 may be disposed on a first edge portion 191 of the package substrate 100. The first chip connection patterns 111 may be disposed on the first edge portion 191 adjacent to the first chip stack 420. First bonding wires 510 may be electrically connected to the first chip connection patterns 111. The first bonding wires 510 may electrically connect the first semiconductor chips 200 of the first chip stack 420 to each other. The first chip connection patterns 111 may correspond to conductive pads which are electrically connected to first ends of the first bonding wires 510. The first semiconductor chips 200 constituting the first chip stack 420 may be electrically connected to the first chip connection patterns 111 through the first bonding wires 510.

Second chip connection patterns 113 of the chip connection patterns 111 and 113 may be disposed on a second edge portion 193 of the package substrate 100. The second edge portion 193 may be an edge portion of the package substrate 100 opposite to the first edge portion 191. The second chip connection patterns 113 may be disposed on the second edge portion 193 adjacent to the second chip stack 430. Second bonding wires 530 may be electrically connected to the second chip connection patterns 113. The second bonding wires 530 may electrically connect the second semiconductor chips 300 of the second chip stack 430 to each other. The second chip connection patterns 113 may correspond to conductive pads which are electrically connected to first ends of the second bonding wires 530. The second semiconductor chips 300 constituting the second chip stack 430 may be electrically connected to the second chip connection patterns 113 through the second bonding wires 530.

The semiconductor package 10 may include an encapsulant 150 covering the first substrate surface 101 of the package substrate 100 and the first and second chip stacks 420 and 430 disposed on the first substrate surface 101. The encapsulant 150 may be provided to protect the first and second semiconductor chips 200 and 300 constituting the first and second chip stacks 420 and 430 from an external environment. The encapsulant 150 may include any one of various dielectric materials or any one of various insulation materials. For example, the encapsulant 150 may be a molding layer including an epoxy molding compound (EMC) material.

Referring again to FIG. 1, each of the first and second chip stacks 420 and 430 may include the first or second semiconductor chips 200 or 300 that are stacked on the package substrate 100 to provide a step structure. The first and second semiconductor chips 200 or 300 may be fixed to the package substrate 100 by an adhesive layer 600 which is disposed between the first semiconductor chips 200, between the second semiconductor chips 300, between the first chip stack 420 and the package substrate 100, and between the second chip stack 430 and the package substrate 100.

Each of the first and second chip stacks 420 and 430 may include the first or second semiconductor chips 200 or 300 that are stacked to provide a step structure. The first and second semiconductor chips 200 and 300 may be stacked on the package substrate 100 so that the first chip stack 420 and the second chip stack 430 may be asymmetric to a vertical straight line between first and second chip stacks 420 and 430. For example, the first semiconductor chips 200 may be sequentially stacked to be offset in a first offset direction 422 to provide the first chip stack 420 having a step structure, and the second semiconductor chips 300 may be sequentially stacked to be offset in a second offset direction 432 to provide the second chip stack 430 having a step structure. In such a case, the first offset direction 422 may be an opposite direction to the second offset direction 432.

Each of the first semiconductor chips 200 may include first chip pads 511 which are electrically connected to the package substrate 100 through the first bonding wires 510. At least one of the first semiconductor chips 200 may have a thickness (or a size) which is different from a thickness (or a size) of the others of the first semiconductor chips 200. However, if the semiconductor package 10 is a memory package, the first semiconductor chips 200 may be memory chips having substantially the same thickness and size. For example, each of the first semiconductor chips 200 may have a first surface 201 and a second surface 203 which are opposite to each other as well as a first sidewall 205 and a second sidewall 206 which are opposite to each other. In such a case, each of the first semiconductor chips 200 may be stacked on the package substrate 100 so that the first surface 201 is located at an opposite side of the package substrate 100 and the second surface 203 faces the first substrate surface 101 of the package substrate 100. In each of the first semiconductor chips 200, the first chip pads 511 may be disposed on a first chip pad region 201E corresponding to an edge portion of the first surface 201. The first semiconductor chips 200 may be stacked on the package substrate 100 so that the first chip pads 511 of the first semiconductor chips 200 are adjacent to the first edge portion 191 or the first chip connection patterns 111 of the package substrate 100.

A first chip 210 of the first semiconductor chips 200 may be attached to the first substrate surface 101 of the package substrate 100 by the adhesive layer 600, and a second chip 220 of the first semiconductor chips 200 may be attached to the first chip 210 of the first semiconductor chips 200 by the adhesive layer 600. The second chip 220 of the first semiconductor chips 200 may be offset from the first chip 210 by a certain distance in the first offset direction 422 so that the first chip pads 511 of the first chip 210 are exposed. Similarly, a third chip 230 and a fourth chip 240 of the first semiconductor chips 200 may be sequentially stacked and offset by a certain distance in the first offset direction 422 so that the first chip pads 511 of the second and third chips 220 and 230 are exposed.

The first bonding wires 510 may electrically connect the first chip connection patterns 111 of the package substrate 100 to the first chip pads 511 of the first chip 210 of the first semiconductor chips 200. The first bonding wires 510 may extend to electrically connect the first chip pads 511 of the first chip 210 to the first chip pads 511 of the second chip 220. Further, the first bonding wires 510 may extend to electrically connect the first chip pads 511 of the second chip 220 to the first chip pads 511 of the third chip 230. The first bonding wires 510 may extend to electrically connect the first chip pads 511 of the third chip 230 to the first chip pads 511 of the fourth chip 240. The first to fourth chips 210, 220, 230 and 240 of the first semiconductor chips 200 may be electrically connected to the package substrate 100 through the first bonding wires 510.

The first chip stack 420 may have a first forward stepwise sidewall 425 which is adjacent to the first edge portion 191 or the first chip connection patterns 111 of the package substrate 100 and a first reverse stepwise sidewall 426 which is opposite to the first forward stepwise sidewall 425. The first forward stepwise sidewall 425 may be comprised of the first sidewalls 205 and the first chip pad regions 201E of the first semiconductor chips 200. The first reverse stepwise sidewall 426 may be comprised of the second sidewalls 206 and exposed second surfaces 203E of the first semiconductor chips 200. The first forward stepwise sidewall 425 of the first chip stack 420 may be adjacent to a first sidewall 152 of the encapsulant 150. That is, the first chip stack 420 may be disposed on the package substrate 100 so that the first forward stepwise sidewall 425 faces the first sidewall 152 of the encapsulant 150.

An upper corner of the first chip stack 420 adjacent to the first reverse stepwise sidewall 426 may provide a first protrusion corner 429 that protrudes in the first offset direction 422. The first protrusion corner 429 of the first chip stack 420 may correspond to a portion of the fourth chip 240 protruding from the second sidewall 206 of the third chip 230 to have a eaves shape or an overhang shape.

Each of the second semiconductor chips 300 may include second chip pads 531 which are electrically connected to the package substrate 100 through the second bonding wires 530. At least one of the second semiconductor chips 200 may have a thickness (or a size) which is different from a thickness (or a size) of the others of the second semiconductor chips 300. However, if the semiconductor package 10 is a memory package, the second semiconductor chips 300 may be memory chips having substantially the same thickness and size. The second semiconductor chips 300 may be integrated circuit chips having the same function as the first semiconductor chips 200. For example, the second semiconductor chips 300 may be memory chips.

Each of the second semiconductor chips 300 may have a second chip pad region 301E corresponding to an edge portion thereof, and the second chip pads 531 may be disposed on the second chip pad region 301E. The second semiconductor chips 300 may be stacked on the package substrate 100 so that the second chip pads 531 of the second semiconductor chips 300 are adjacent to the second edge portion 193 or the second chip connection patterns 113 of the package substrate 100. A first chip 310 of the second semiconductor chips 300 may be attached to the first substrate surface 101 of the package substrate 100 by the adhesive layer 600, and a second chip 320 of the second semiconductor chips 300 may be attached to the first chip 310 of the second semiconductor chips 300 by the adhesive layer 600. The second chip 320 of the second semiconductor chips 300 may be offset from the first chip 310 by a certain distance in the second offset direction 432 so that the second chip pads 531 of the first chip 310 are exposed. Similarly, a third chip 330 and a fourth chip 340 of the second semiconductor chips 300 may be sequentially stacked and offset by a certain distance in the second offset direction 432 so that the second chip pads 531 of the second and third chips 320 and 330 are exposed.

The second bonding wires 530 may electrically connect the second chip connection patterns 113 of the package substrate 100 to the second chip pads 531 of the first chip 310 of the second semiconductor chips 300. The second bonding wires 530 may extend to electrically connect the second chip pads 531 of the first chip 310 to the second chip pads 531 of the second chip 320. The second bonding wires 530 may extend to electrically connect the second chip pads 531 of the second chip 320 to the second chip pads 531 of the third chip 330. The second bonding wires 530 may extend to electrically connect the second chip pads 531 of the third chip 330 to the second chip pads 531 of the fourth chip 340. The first to fourth chips 310, 320, 330 and 340 of the second semiconductor chips 300 may be electrically connected to the package substrate 100 through the second bonding wires 530. Although FIG. 1 illustrates an example in which the first chip stack 420 includes the first to fourth chips 210~240 and the second chip stack 430 includes the first to fourth chips 310~340, the number of the stacked chips of the first chip stack 420 and the number of the stacked chips of the second chip stack 430 may be greater than four according to the embodiments.

The second chip stack 430 may have a second forward stepwise sidewall 435 which is adjacent to the second edge portion 193 or the second chip connection patterns 113 of the package substrate 100 and a second reverse stepwise sidewall 436 which is opposite to the second forward stepwise sidewall 435. The first and second chip stacks 420 and 430 may be disposed on the substrate package 100 so that the second reverse stepwise sidewall 436 of the second chip stack 430 faces the first reverse stepwise sidewall 426 of the first chip stack 420. The second forward stepwise sidewall 435 of the second chip stack 430 may be adjacent to a second sidewall 153 of the encapsulant 150 which is opposite to the first sidewall 152. That is, the second chip stack 430 may be disposed on the package substrate 100 so that the second forward stepwise sidewall 435 faces the second sidewall 153 of the encapsulant 150.

Each of the second semiconductor chips 300 may have a second thickness D2 which is less than a first thickness D1 of each of the first semiconductor chips 200. Thus, if the number of the first semiconductor chips 200 is equal to the number of the second semiconductor chips 300, a second height H2 of the second chip stack 430 may be less than a first height H1 of the first chip stack 420. Since the second height H2 of the second chip stack 430 is less than the first height H1 of the first chip stack 420, the second chip stack 430 may be disposed on the package substrate 100 so that a second protrusion corner 439 corresponding to an upper corner of the second chip stack 430 is located below the first protrusion corner 429 of the first chip stack 420.

The first and second chip stacks 420 and 430 may be disposed on the package substrate 100 so that the second protrusion corner 439 of the second chip stack 430 overlaps with the first protrusion corner 429 of the first chip stack 420 in a plan view. That is, the second protrusion corner 439 of the second chip stack 430 may vertically overlap with the first protrusion corner 429 of the first chip stack 420, as illustrated in FIG. 1. The second protrusion corner 439 of the second chip stack 430 may protrude toward the first chip stack 420, and the first protrusion corner 429 of the first chip stack 420 may protrude toward the second chip stack 430. Thus, the second protrusion corner 439 may be located below the first protrusion corner 429 and may be spaced apart from the first protrusion corner 429. As a result, the first and second chip stacks 420 and 430 may be laterally spaced apart from each other, and the second protrusion corner 439 may be located below the first protrusion corner 429 so that the first and second protrusion corners 429 and 439 overlap with each other. Thus, a total width W of the first and second chip stacks 420 and 430 may be reduced even though the first and second chip stacks 420 and 430 are disposed side by side on the package substrate 100. That is, since a width of the semiconductor package 10 is reduced, a size of the semiconductor package 10 may also be reduced.

Since the first and second chip stacks 420 and 430 are disposed so that the first forward stepwise sidewall 425 is adjacent to the first sidewall 152 of the encapsulant 150 and the second forward stepwise sidewall 435 is adjacent to the second sidewall 153 of the encapsulant 150 opposite to the first sidewall 152, the first bonding wires 510 connected to the first chip pads 511 on the first forward stepwise sidewall 425 and the second bonding wires 530 connected to the second chip pads 531 on the second forward stepwise sidewall 435 may be located at both edge portions of the package substrate 100. That is, the first bonding wires 510 and the second bonding wires 530 may be connected to the first chip connection patterns 111 and the second chip connection patterns 113, which are disposed at both edge portions of the package substrate 100, respectively.

Figure 2:
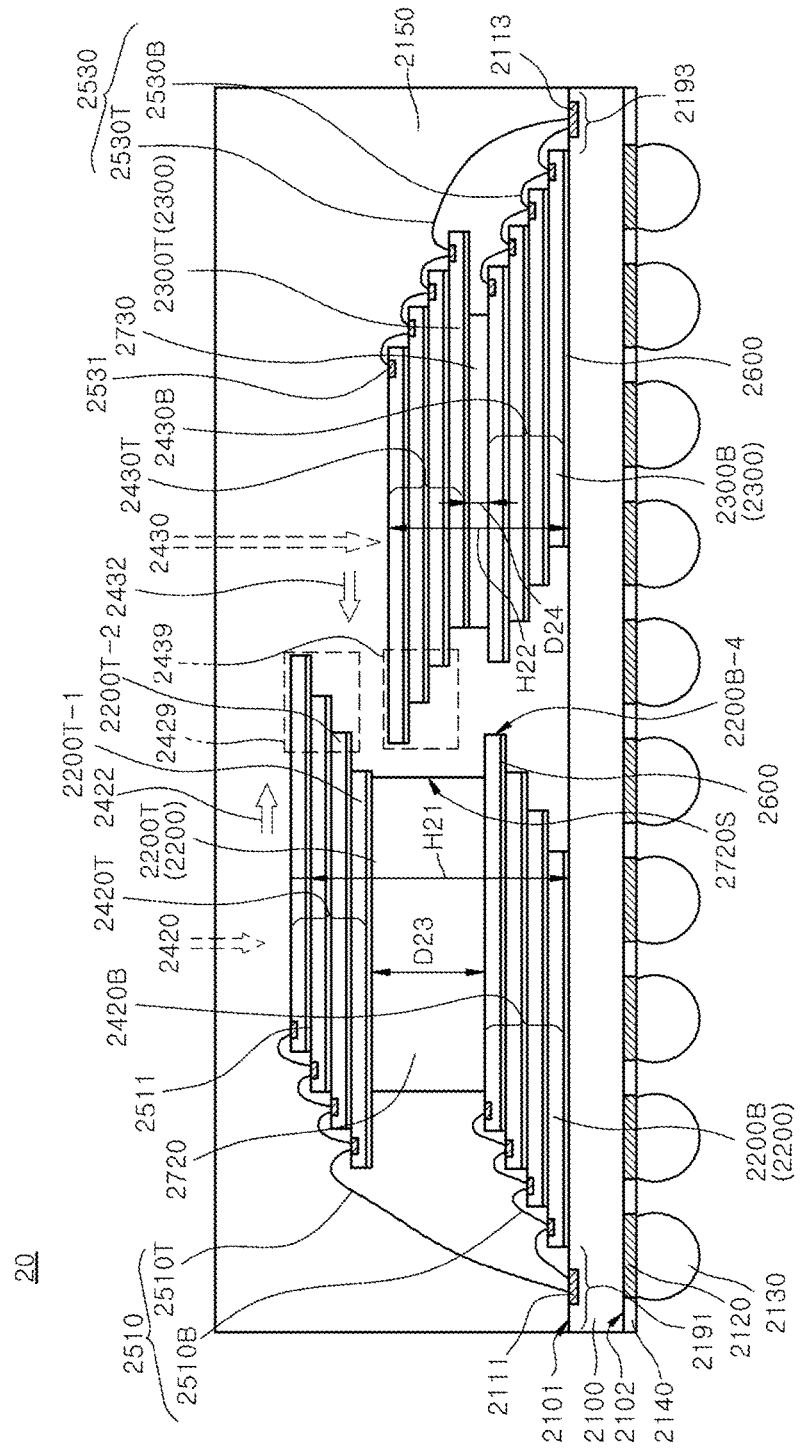
FIG. 2 is a cross-sectional view illustrating a representation of an example of a semiconductor package according to an embodiment.

FIG. 2 is a cross-sectional view illustrating a representation of an example of a semiconductor package 20 according to an embodiment.

Referring to FIG. 2, the semiconductor package 20 may include a first chip stack 2420 and a second chip stack 2430 which are stacked side by side on a package substrate 2100. The first chip stack 2420 and the second chip stack 2430 may be stacked on the package substrate 2100 to be adjacent to each other in a lateral direction which is parallel to a surface of the package substrate 2100. The first chip stack 2420 may include a plurality of first semiconductor chips 2200 and a first spacer 2720 which are stacked to be offset in a first offset direction 2422, and the second chip stack 2430 may include a plurality of second semiconductor chips 2300 which are stacked to be offset in a second offset direction 2432. The first offset direction 2422 may be an opposite direction to the second offset direction 2432. The first spacer 2720 may be used as an intermediate layer of the first chip stack 2420. For example, the first spacer 2720 may be disposed between two adjacent chips of the first semiconductor chips 2200. The first spacer 2720 may be provided to increase a first height H21 of the first chip stack 2420 so that the first height H21 is greater than a second height H22 of the second chip stack 2430.

Since the first height H21 of the first chip stack 2420 is greater than the second height H22 of the second chip stack 2430 due to the presence of the first spacer 2720, the first and second chip stacks 2420 and 2430 may be disposed side by side on the package substrate 2100 so that a first protrusion corner 2429 of the first chip stack 2420 is located over a second protrusion corner 2439 of the second chip stack 2430. As a result, the first protrusion corner 2429 of the first chip stack 2420 may overlap with the second protrusion corner 2439 of the second chip stack 2430 in a plan view. That is, the second protrusion corner 2439 of the second chip stack 2430 may vertically overlap with the first protrusion corner 2429 of the first chip stack 2420, as illustrated in FIG. 2.

The second chip stack 2430 may further include a second spacer 2730 having a second thickness D24 which is different from a first thickness D23 of the first spacer 2720. The second thickness D24 of the second spacer 2730 may be less than the first thickness D23 of the first spacer 2720. The first and second spacers 2720 and 2730 may be two dielectric layers having different thicknesses. For example, the first and second spacers 2720 and 2730 may be two dielectric tapes having different thicknesses. In some embodiments, each of the first and second spacers 2720 and 2730 may include a semiconductor material or a metal material. For example, each of the first and second spacers 2720 and 2730 may be a dummy semiconductor chip having no integrated circuit. The dummy semiconductor chip may be comprised of substantially the same material (e.g., a silicon material) as the first and second semiconductor chips 2200 and 2300. In such a case, a thermal expansion coefficient difference between the first spacer 2720 (or the second spacer 2730) and the first semiconductor chips 2200 (or the second semiconductor chips 2300) may be minimized to improve the thermal stability of the semiconductor package 20.

The first and second semiconductor chips 2200 and 2300 may be attached to each other by an adhesive layer 2600. The first and second semiconductor chips 2200 and 2300 may be attached to the package substrate 2100 and the spacers 2720 and 2730 by the adhesive layer 2600. The package substrate 2100 may have a first substrate surface 2101 on which the first and second chip stacks 2420 and 2430 are stacked and a second substrate surface 2102 which is located opposite to the first and second chip stacks 2420 and 2430. First chip connection patterns 2111 may be disposed on a first edge portion 2191 of the package substrate 2100, and second chip connection patterns 2113 may be disposed on a second edge portion 2193 of the package substrate 2100 opposite to the first edge portion 2191. First bonding wires 2510 may electrically connect the first chip connection patterns 2111 to first chip pads 2511 of the first semiconductor chips 2200 constituting the first chip stack 2420. Second bonding wires 2530 may electrically connect the second chip connection patterns 2113 to second chip pads 2531 of the second semiconductor chips 2300 constituting the second chip stack 2430. An encapsulant 2150 may be provided to cover the first substrate surface 2101 of the package substrate 2100 and the first and second chip stacks 2420 and 2430 disposed on the first substrate surface 2101. Ball connection patterns 2120 may be disposed on the second substrate surface 2102 of the package substrate 2100, and outer connectors 2130 may be attached to the ball connection patterns 2120, respectively. A dielectric layer 2140 may be disposed on the second substrate surface 2102 of the package substrate 2100. The dielectric layer 2140 may be disposed to expose the ball connection patterns 2120.

Referring again to FIG. 2, the first chip stack 2420 may include a first sub-chip stack 2420B, the first spacer 2720 and a second sub-chip stack 2420T which are sequentially stacked on the first substrate surface 2101 of the package substrate 2100. The first sub-chip stack 2420B may include first sub-chips 2200B which are stacked to be offset in the first offset direction 2422, and the second sub-chip stack 2420T may include second sub-chips 2200T which are stacked to be offset in the first offset direction 2422. The first spacer 2720 may have a first thickness D23 and may function as an elevating member for increasing a height of the second sub-chip stack 2420T by the first thickness D23.

The second chip stack 2430 may include a third sub-chip stack 2430B, the second spacer 2730 and a fourth sub-chip stack 2430T which are sequentially stacked on the first substrate surface 2101 of the package substrate 2100. The third sub-chip stack 2430B may include third sub-chips 2300B which are stacked to be offset in the second offset direction 2432, and the fourth sub-chip stack 2430T may include fourth sub-chips 2300T which are stacked to be offset in the second offset direction 2432. The second spacer 2730 may have a second thickness D24 and may function as an elevating member for increasing a height of the fourth sub-chip stack 2430T by the second thickness D24.

Each of the first semiconductor chips 2200 including the first sub-chips 2200B and the second sub-chips 2200T may have substantially the same thickness as each of the second semiconductor chips 2300 including the third sub-chips 2300B and the fourth sub-chips 2300T. The number of the first semiconductor chips 2200 may be equal to the number of the second semiconductor chips 2300. The first sub-chips 2200B, the second sub-chips 2200T, the third sub-chips 2300B and the fourth sub-chips 2300T may include the same number of chips. The first thickness D23 of the first spacer 2720 may be different from the second thickness D24 of the second spacer 2730. In such a case, even though the number of the first semiconductor chips 2200 is equal to the number of the second semiconductor chips 2300 and each of the first semiconductor chips 2200 has the same thickness as each of the second semiconductor chips 2300, a first height H21 of the first chip stack 2420 may be different from a second height H22 of the second chip stack 2430.

Since the first thickness D23 of the first spacer 2720 is greater than the second thickness D24 of the second spacer 2730, the second chip stack 2430 may be disposed on the package substrate 2100 so that a second protrusion corner 2439 corresponding to an upper protrusion corner of the fourth sub-chip stack 2430T protruding in the second offset direction 2432 may protrude from the second spacer 2730 in the second offset direction 2432 to face a sidewall of the first spacer 2720. The second protrusion corner 2439 of the second chip stack 2430 may be spaced apart from the first spacer 2720 so that the encapsulant 2150 may easily flow into a space between the first and second chip stacks 2420 and 2430 during a packaging process. The second protrusion corner 2439 of the second chip stack 2430 may be located below a first protrusion corner 2429 corresponding to an upper protrusion corner of the first sub-chip stack 2420T protruding in the first offset direction 2422. The second protrusion corner 2439 may protrude from the second spacer 2730 in the second offset direction 2432, and the first protrusion corner 2429 may protrude from the first spacer 2720 in the first offset direction 2422.

The first spacer 2720 may be disposed to expose an edge portion of a topmost chip 2200B-4 of the first sub-chip stack 2420B. The topmost chip 2200B-4 of the first sub-chip stack 2420B may be attached to a bottom surface of the first spacer 2720. The first spacer 2720 may be disposed so that a sidewall 2720S of the first spacer 2720 adjacent to the second chip stack 2430 is recessed from a sidewall of the topmost chip 2200B-4 adjacent to the second chip stack 2430. That is, an edge portion of the topmost chip 2200B-4 may protrude from the sidewall 2720S of the first spacer 2720 in the first offset direction 2422. Accordingly, a width of the first spacer 2720 may be less than a width of the topmost chip 2200B-4 of the first sub-chip stack 2420B.

The first spacer 2720 may be disposed so that the sidewall 2720S of the first spacer 2720 is recessed from or aligned with a sidewall of a bottommost chip 2200T-1 of the second sub-chip stack 2420T adjacent to the second chip stack 2430. The bottommost chip 2200T-1 of the second sub-chip stack 2420T may correspond to a chip attached to a top surface of the first spacer 2720. A second bottommost chip 2200T-2 of the second sub-chip stack 2420T may be stacked on the bottommost chip 2200T-1 to be offset in the first offset direction 2422.

The second chip stack 2430 may be disposed so that the second protrusion corner 2439 of the second chip stack 2430 is inserted into a space surrounded by a "C"-shaped sidewall between an edge portion of the topmost chip 2200B-4 and an edge portion of the second bottommost chip 2200T-2. That is, a portion of the second protrusion corner 2439 may be located to overlap with the edge portions of the topmost chip 2200B-4 and the second bottommost chip 2200T-2, in a plan view. Thus, the first and second chip stacks 2420 and 2430 may be disposed to be laterally close to each other. As a result, a size of the semiconductor package 20 may be reduced.

The first sub-chips 2200B constituting the first sub-chip stack 2420B may be electrically connected to the first chip connection patterns 2111 through first sub-bonding wires 2510B of the first bonding wires 2510, and the second sub-chips 2200T constituting the second sub-chip stack 2420T may be electrically connected to the first chip connection patterns 2111 through second sub-bonding wires 2510T of the first bonding wires 2510. The third sub-chips 2300B constituting the third sub-chip stack 2430B may be electrically connected to the second chip connection patterns 2113 through third sub-bonding wires 2530B of the second bonding wires 2530, and the fourth sub-chips 2300T constituting the fourth sub-chip stack 2430T may be electrically connected to the second chip connection patterns 2113 through fourth sub-bonding wires 2530T of the second bonding wires 2530.

Figure 3:
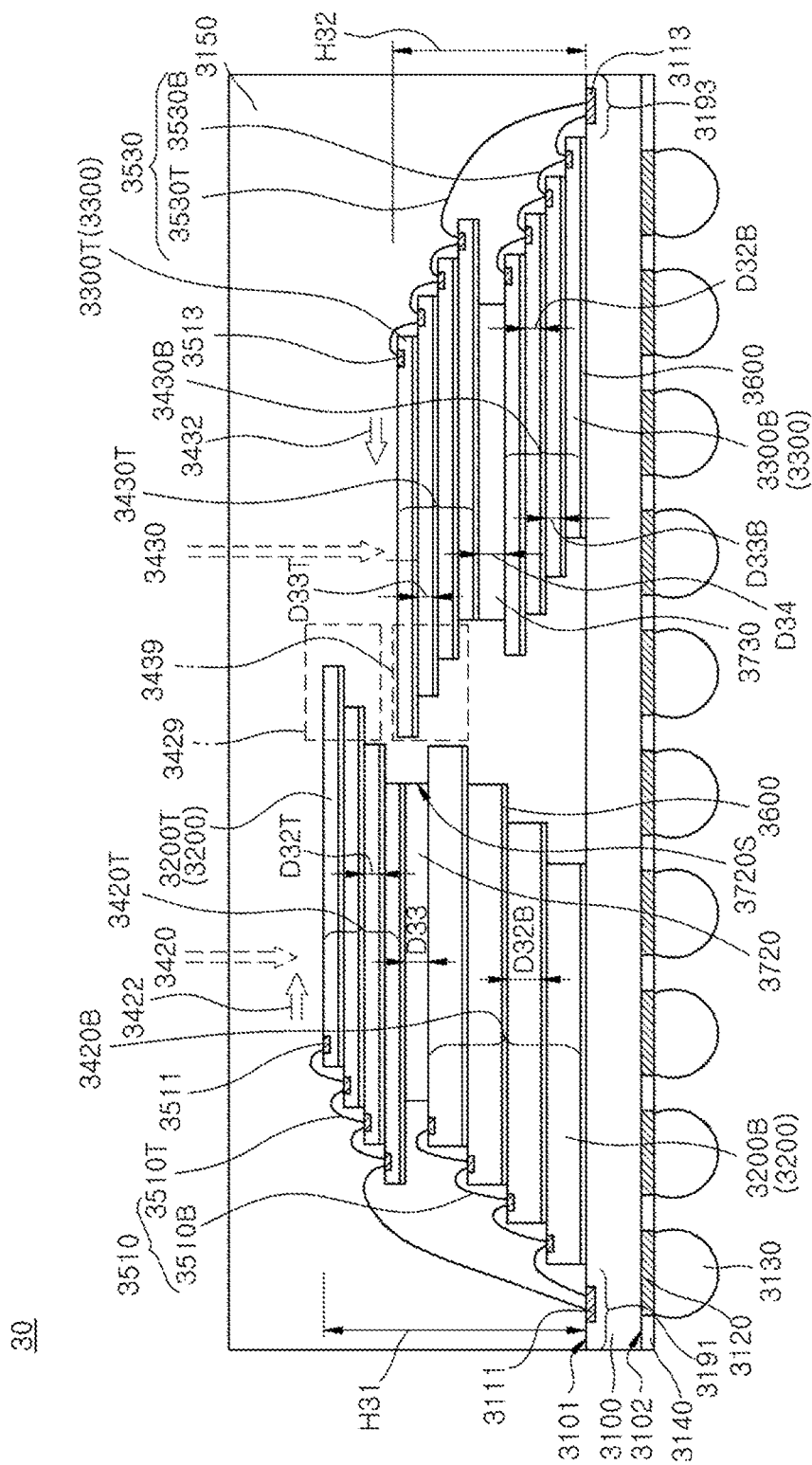
FIG. 3 is a cross-sectional view illustrating a representation of an example of a semiconductor package according to an embodiment.

FIG. 3 is a cross-sectional view illustrating a representation of an example of a semiconductor package 30 according to an embodiment.

Referring to FIG. 3, the semiconductor package 30 may include a first chip stack 3420 and a second chip stack 3430 which are stacked side by side on a package substrate 3100. The first chip stack 3420 and the second chip stack 3430 may be stacked on the package substrate 3100 to be adjacent to each other in a lateral direction which is parallel to a surface of the package substrate 3100. The first chip stack 3420 may include a plurality of first semiconductor chips 3200 and a first spacer 3720 which are stacked to be offset in a first offset direction 3422, and the second chip stack 3430 may include a plurality of second semiconductor chips 3300 which are stacked to be offset in a second offset direction 3432. The first offset direction 3422 may be an opposite direction to the second offset direction 3432. The first spacer 3720 may be used as an intermediate layer of the first chip stack 3420. For example, the first spacer 3720 may be disposed between two adjacent chips of the first semiconductor chips 3200. The second chip stack 3430 may further include a second spacer 3730 having a second thickness D34 which is substantially equal to a first thickness D33 of the first spacer 3720.

The first and second semiconductor chips 3200 and 3300 may be attached to each other by an adhesive layer 3600. In addition, the first and second semiconductor chips 3200 and 3300 may be attached to the package substrate 3100 and the spacers 3720 and 3730 by the adhesive layer 3600. The package substrate 3100 may have a first substrate surface 3101 on which the first and second chip stacks 3420 and 3430 are stacked and a second substrate surface 3102 which is located opposite to the first and second chip stacks 3420 and 3430. First chip connection patterns 3111 may be disposed on a first edge portion 3191 of the package substrate 3100, and second chip connection patterns 3113 may be disposed on a second edge portion 3193 of the package substrate 3100 opposite to the first edge portion 3191. First bonding wires 3510 may electrically connect the first chip connection patterns 3111 to first chip pads 3511 of the first semiconductor chips 3200 constituting the first chip stack 3420. Second bonding wires 3530 may electrically connect the second chip connection patterns 3113 to second chip pads 3513 of the second semiconductor chips 3300 constituting the second chip stack 3430. An encapsulant 3150 may be provided to cover the first substrate surface 3101 of the package substrate 3100 and the first and second chip stacks 3420 and 3430 disposed on the first substrate surface 3101. Ball connection patterns 3120 may be disposed on the second substrate surface 3102 of the package substrate 3100, and outer connectors 3130 may be attached to the ball connection patterns 3120, respectively. A dielectric layer 3140 may be disposed on the second substrate surface 3102 of the package substrate 3100. The dielectric layer 3140 may be disposed to expose the ball connection patterns 3120.

Referring again to FIG. 3, the first chip stack 3420 may include a first sub-chip stack 3420B, the first spacer 3720 and a second sub-chip stack 3420T which are sequentially stacked on the first substrate surface 3101 of the package substrate 3100. The first sub-chip stack 3420B may include first sub-chips 3200B which are stacked to be offset in the first offset direction 3422, and the second sub-chip stack 3420T may include second sub-chips 3200T which are stacked to be offset in the first offset direction 3422. The first spacer 3720 may be stacked on the first sub-chip stack 3420B, and the second sub-chip stack 3420T may be stacked on the first spacer 3720. The first spacer 3720 may function as an elevating member for increasing a height of the second sub-chip stack 3420T by the first thickness D33.

The second chip stack 3430 may include a third sub-chip stack 3430B, the second spacer 3730 and a fourth sub-chip stack 3430T which are sequentially stacked on the first substrate surface 3101 of the package substrate 3100. The third sub-chip stack 3430B may include third sub-chips 3300B which are stacked to be offset in the second offset direction 3432, and the fourth sub-chip stack 3430T may include fourth sub-chips 3300T which are stacked to be offset in the second offset direction 3432. The second spacer 3730 may be stacked on the third sub-chip stack 3430B, and the fourth sub-chip stack 3430T may be stacked on the second spacer 3730. The second spacer 3730 may function as an elevating member for increasing a height of the fourth sub-chip stack 3430T by the second thickness D34.

If a thickness of any one of the first semiconductor chips 3200 constituting the first and second sub-chips 3200B and 3200T or a total thickness of the first semiconductor chips 3200 is greater than a total thickness of the second semiconductor chips 3300 constituting the third and fourth sub-chips 3300B and 3300T, a first height H31 of the first chip stack 3420 may be different from a second height H32 of the second chip stack 3430 even though the number of the first semiconductor chips 3200 is equal to the number of the second semiconductor chips 3300 and the first thickness D33 of the of the first spacer 3720 is equal to the second thickness D34 of the second spacer 3730.

In some embodiments, the second, third and fourth sub-chips 3200T, 3300B and 3300T may have substantially the same thickness. If a third thickness D32B of each of the first sub-chips 3200B is greater than a fourth thickness D32T of each of the second sub-chips 3200T, a fifth thickness D33B of each of the third sub-chips 3300B, or a sixth thickness D33T of each of the fourth sub-chips 3300T, the first height H31 of the first chip stack 3420 may be greater than the second height H32 of the second chip stack 3430. Thus, a second protrusion corner 3439 corresponding to an upper protrusion corner of the fourth sub-chip stack 3430T protruding in the second offset direction 3432 may be located below a first protrusion corner 3429 corresponding to an upper protrusion corner of the first sub-chip stack 3420T protruding in the first offset direction 3422. The second protrusion corner 3439 of the second chip stack 3430 may face a sidewall 3720S of first spacer 3720.

The first sub-chips 3200B constituting the first sub-chip stack 3420B may be electrically connected to the first chip connection patterns 3111 through first sub-bonding wires 3510B of the first bonding wires 3510, and the second sub-chips 3200T constituting the second sub-chip stack 3420T may be electrically connected to the first chip connection patterns 3111 through second sub-bonding wires 3510T of the first bonding wires 3510. The third sub-chips 3300B constituting the third sub-chip stack 3430B may be electrically connected to the second chip connection patterns 3113 through third sub-bonding wires 3530B of the second bonding wires 3530, and the fourth sub-chips 3300T constituting the fourth sub-chip stack 3430T may be electrically connected to the second chip connection patterns 3113 through fourth sub-bonding wires 3530T of the second bonding wires 3530.

A semiconductor package according to an embodiment a first chip stack and a second chip stack may be disposed side by side on a package substrate and may be spaced apart from each other in a lateral direction. Thus, the number of semiconductor chips embedded in the semiconductor package may increase, whereas a height of the semiconductor package is reduced. An offset direction of the semiconductor chips stacked to constitute the first chip stack may be different from an offset direction of the semiconductor chips stacked to constitute the second chip stack. In such a case, upper protrusion corners of the first and second chip stacks may overlap with each other in a plan view to reduce a width of the semiconductor package. In order to realize the first and second chip stacks having different heights, a thickness of at least one of the semiconductor chips constituting the first and second chip stacks may be greater than the others of the semiconductor chips or a spacer may be disposed between the semiconductor chips constituting the first or second chip stack.

Figure 4:
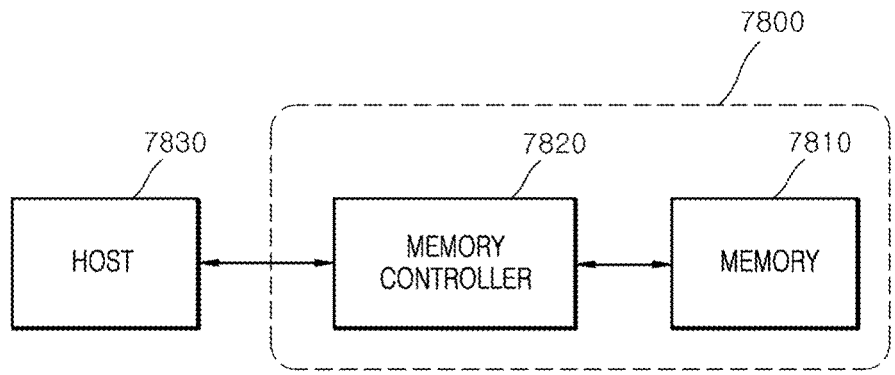
FIG. 4 is a block diagram illustrating a representation of an example of an electronic system employing a memory card including at least one of semiconductor packages according to some embodiments.

FIG. 4 is a block diagram illustrating a representation of an example of an electronic system including a memory card 7800 including at least one of the semiconductor packages according to the embodiments. The memory card 7800 includes a memory 7810 such as a nonvolatile memory device, and a memory controller 7820. The memory 7810 and the memory controller 7820 may store data or read stored data. The memory 7810 and/or the memory controller 7820 include one or more semiconductor chips disposed in a semiconductor package according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 5:
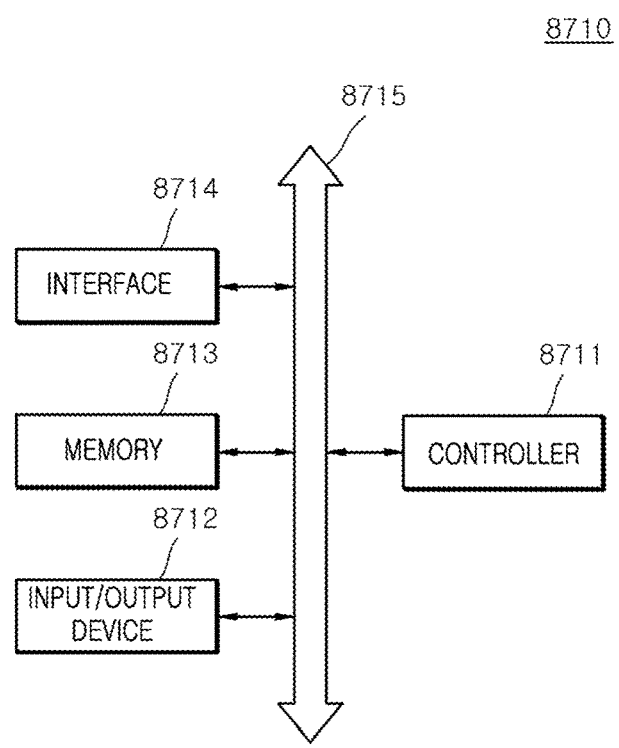
FIG. 5 is a block diagram illustrating a representation of an example of an electronic system including at least one of semiconductor packages according to some embodiments.

FIG. 5 is a block diagram illustrating a representation of an example of an electronic system 8710 including at least one of the packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first chip stack including first chips which are stacked on a package substrate and offset in a first offset direction; and
   a second chip stack including second chips which are stacked on the package substrate and offset in a second offset direction corresponding to an opposite direction to the first offset direction,
   wherein a first protrusion corner of the first chip stack protruding toward the second chip stack vertically overlaps with a second protrusion corner of the second chip stack protruding toward the first chip stack, and
   wherein the first chip stack and the second chip stack are laterally aligned.

2. The semiconductor package of claim 1, further comprising an encapsulant covering the first and second chip stacks,
   wherein the first chip stack is disposed so that a first forward stepwise sidewall of the first chip stack faces a first sidewall of the encapsulant, and a first reverse stepwise sidewall of the first chip stack opposite to the first forward stepwise sidewall faces the second chip stack; and
   wherein the second chip stack is disposed so that a second forward stepwise sidewall of the second chip stack faces a second sidewall of the encapsulant opposite to the first sidewall, and a second reverse stepwise sidewall of the second chip stack opposite to the second forward stepwise sidewall faces the first reverse stepwise sidewall of the first chip stack.

3. The semiconductor package of claim 2, wherein the second chip stack is disposed so that the second protrusion corner of the second chip stack faces the first reverse stepwise sidewall of the first chip stack.

4. The semiconductor package of claim 1, further comprising:

a first bonding wire electrically connecting the package substrate to the first chips; and a second bonding wire electrically connecting the package substrate to the second chips, wherein the first bonding wire is disposed on a sidewall of the first chip stack opposite to the second chip stack, and the second bonding wire is disposed on a sidewall of the second chip stack opposite to the first chip stack.

5. The semiconductor package of claim 4, wherein the package substrate includes:

a substrate body;

a first chip connection pattern disposed on a first edge portion of the substrate body and connected to the first bonding wire; and a second chip connection pattern disposed on a second edge portion of the substrate body opposite to the first edge portion and connected to the second bonding wire.

6. The semiconductor package of claim 1, wherein a height of the second chip stack is less than a height of the first chip stack.

7. The semiconductor package of claim 1, wherein at least one of the second chips has a thickness which is less than a thickness of any one of the first chips.

8. The semiconductor package of claim 1, wherein the first chip stack is spaced apart from the second protrusion corner of the second chip stack.

9. A semiconductor package comprising:

a first chip stack including first chips which are stacked on a package substrate and offset to form a first reverse stepwise sidewall; and a second chip stack including second chips which are stacked on the package substrate and offset to form a second reverse stepwise sidewall, wherein a first protrusion corner of the first chip stack protruding toward the second chip stack vertically overlaps with a second protrusion corner of the second chip stack protruding toward the first chip stack, and wherein the first chip stack and the second chip stack are laterally aligned.

10. The semiconductor package of claim 9, wherein the second chip stack includes a second protrusion corner protruding toward the first protrusion corner.

11. The semiconductor package of claim 10, wherein the first protrusion corner vertically overlaps with the second protrusion corner.

12. The semiconductor package of claim 9, wherein the first protrusion corner protrudes toward the center of the package substrate.

13. The semiconductor package of claim 9, wherein the first protrusion corner protrudes away from a first edge portion of the package substrate.

14. The semiconductor package of claim 13, further comprising:

a first bonding wire electrically connecting the package substrate at the first edge portion to the first chips.

15. The semiconductor package of claim 9, wherein at least one of the second chips has a thickness which is less than a thickness of any one of the first chips.

16. A semiconductor package comprising:

a first chip stack including first chips which are stacked on a package substrate and offset in a first offset direction;

a second chip stack including second chips which are stacked on the package substrate and offset in a second offset direction;

a first spacer disposed between two adjacent chips of the first chips; and a second spacer disposed between two adjacent chips of the second chips, wherein a first protrusion corner of the first chip stack protrudes toward the second chip stack with a second protrusion corner of the second chip stack protruding towards the first chip stack, and a thickness of the second spacer is different from a thickness of the first spacer.

17. The semiconductor package of claim 16, wherein the number of first chips is equal to the number of second chips.

18. The semiconductor package of claim 16, wherein the second protrusion corner of the second chip stack is spaced apart from the first spacer of the first chip stack to allow an encapsulant to flow into a space between the first and second chip stacks.

* * * * *